United States Patent
Dickinson et al.

(10) Patent No.: US 8,747,762 B2
(45) Date of Patent: Jun. 10, 2014

(54) METHODS AND APPARATUS FOR TREATING EXHAUST GAS IN A PROCESSING SYSTEM

(75) Inventors: Colin John Dickinson, San Jose, CA (US); Mehran Moalem, Cupertino, CA (US); Daniel O. Clark, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 467 days.

(21) Appl. No.: 12/957,539

(22) Filed: Dec. 1, 2010

(65) Prior Publication Data
US 2011/0135552 A1 Jun. 9, 2011

Related U.S. Application Data

(60) Provisional application No. 61/266,396, filed on Dec. 3, 2009.

(51) Int. Cl.
*B01J 19/08* (2006.01)

(52) U.S. Cl.
USPC .............. 422/186.04; 422/186.29; 422/112; 204/164; 588/301; 588/311; 588/260

(58) Field of Classification Search
CPC ............... B01D 2259/818; B01D 2258/0216; B01D 53/32
USPC ........ 422/186.04, 186.29, 112; 588/301, 311, 588/260; 204/164
See application file for complete search history.

(56) References Cited

U.S. PATENT DOCUMENTS

| | | | |
|---|---|---|---|
| 4,795,880 A * | 1/1989 | Hayes et al. | 219/121.52 |
| 6,888,040 B1 | 5/2005 | Shufflebotham et al. | |
| 2002/0111045 A1 | 8/2002 | Arno | |
| 2007/0095282 A1 | 5/2007 | Moon et al. | |
| 2007/0197039 A1 * | 8/2007 | Puech | 438/706 |
| 2008/0264453 A1 | 10/2008 | Taylor | |

FOREIGN PATENT DOCUMENTS

JP 2004223365 A 8/2004

OTHER PUBLICATIONS

English Translation of JP 2004-223365.*
International Search Report and Written Opinion mailed Jul. 26, 2011 for PCT Application No. PCT/US2010/058664.
Tonnis et al., "Evaluation of a Litmas 'Blue' Point-of-Use (POU) Plasma Abatement Device for Perfluorocompound (PFC) Destruction", International SEMATECH, Inc., Technology Transfer # 98123605A-ENG, Austin, TX, Dec. 15, 1998. pp. 1-31.

* cited by examiner

*Primary Examiner* — Xiuyu Tai
(74) *Attorney, Agent, or Firm* — Moser Taboada; Alan Taboada

(57) ABSTRACT

Methods and apparatus for treating an exhaust gas in a foreline of a substrate processing system are provided herein. In some embodiments, an apparatus for treating an exhaust gas in a foreline of a substrate processing system includes a plasma source coupled to a foreline of a process chamber, a reagent source coupled to the foreline upstream of the plasma source, and a foreline gas injection kit coupled to the foreline to controllably deliver a gas to the foreline, wherein the foreline injection kit includes a pressure regulator to set a foreline gas delivery pressure setpoint, and a first pressure gauge coupled to monitor a delivery pressure of the gas upstream of the foreline.

14 Claims, 4 Drawing Sheets

METHODS AND APPARATUS FOR TREATING EXHAUST GAS IN A PROCESSING SYSTEM

CROSS-REFERENCE TO RELATED APPLICATIONS

This application claims benefit of U.S. provisional patent application Ser. No. 61/266,396, filed Dec. 3, 2009, which is herein incorporated by reference.

FIELD

Embodiments of the present invention generally relate to the manufacture of electronic devices, and more specifically, to systems and methods for abating exhaust from electronic device manufacturing systems.

BACKGROUND

Remote plasma sources (RPS) or in-line plasma sources (IPS) have been used for abatement of perfluorocarbons (PFC's) and global warming gases (GWG's). For example, the RPS or IPS may be installed in a foreline of a vacuum system of a substrate processing system between a high vacuum pump, such as a turbo pump, and a backing pump, such as a dry vacuum pump. However, there is currently no method or apparatus to control an operating pressure of the foreline (and hence the RPS or IPS) to optimize abatement of PFCs and/or GWGs. Accordingly, the inventors have provided improved methods and apparatus for treating exhaust gas in a processing system.

SUMMARY

Methods and apparatus for treating an exhaust gas in a foreline of a substrate processing system are provided herein. In some embodiments, methods and apparatus may be provided to control foreline pressure to control and improve abatement destruction efficiency. In some embodiments, methods and apparatus may be provided to supply an intermittent or continuous cleaning gas flow to remove deleterious deposits that can accumulate on surfaces of a plasma abatement device coupled to the foreline. In some embodiments, the cleaning gas flow may be synchronized to the process for optimal cleaning and maximum substrate throughput.

In some embodiments, methods to selectively activate the pressure control or clean in sequence with the tool process recipe are provided to enhance the efficiency, throughput, and uptime of the system. In some embodiments, methods for cost effectively providing accurate and repeatable control of the reagent delivery rate are also provided. The combination of reagent injection control along with foreline pressure control may be provided to manage the plasma within an optimal operating range (for PFC or global warming gas abatement) in real-time.

In some embodiments, an apparatus for cleaning a foreline of a substrate processing system may include a plasma source coupled to a process foreline of a process chamber; a reagent source coupled to the process foreline upstream of the plasma source; and a foreline gas injection kit coupled to the process foreline to controllably deliver a gas to the process foreline, wherein the foreline injection kit includes: a pressure regulator to set a foreline gas delivery pressure setpoint; a gauge to monitor the foreline gas delivery pressure; and a fixed orifice to provide a known flow of gas at the pressure setpoint of the pressure regulator. In some embodiments, the foreline gas injection kit may further include an on/off control valve to selectively turn on and off the flow of the foreline gas to the process foreline. In some embodiments, the foreline gas injection kit may further include a pressure transducer to provide a signal corresponding to the pressure of the foreline gas; and a controller coupled to the signal from the pressure transducer to provide a feedback loop to control the pressure of the foreline gas.

In some embodiments, an apparatus for treating an exhaust gas in a foreline of a substrate processing system includes a plasma source coupled to a foreline of a process chamber, a reagent source coupled to the foreline upstream of the plasma source, and a foreline gas injection kit coupled to the foreline to controllably deliver a gas to the foreline, wherein the foreline injection kit includes a pressure regulator to set a foreline gas delivery pressure setpoint, and a first pressure gauge coupled to monitor a delivery pressure of the gas upstream of the foreline.

In some embodiments, a method for treating an exhaust gas in a foreline of a substrate processing system including flowing an exhaust gas and a reagent gas into a foreline of a substrate processing system, forming a plasma from the exhaust gas and reagent gas to convert the exhaust gas to abatable byproduct gases, and injecting a non-reactive gas into the foreline to maintain a desired pressure in the foreline for optimal conversion of the exhaust gas. Other and further embodiments of the present invention are described below.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
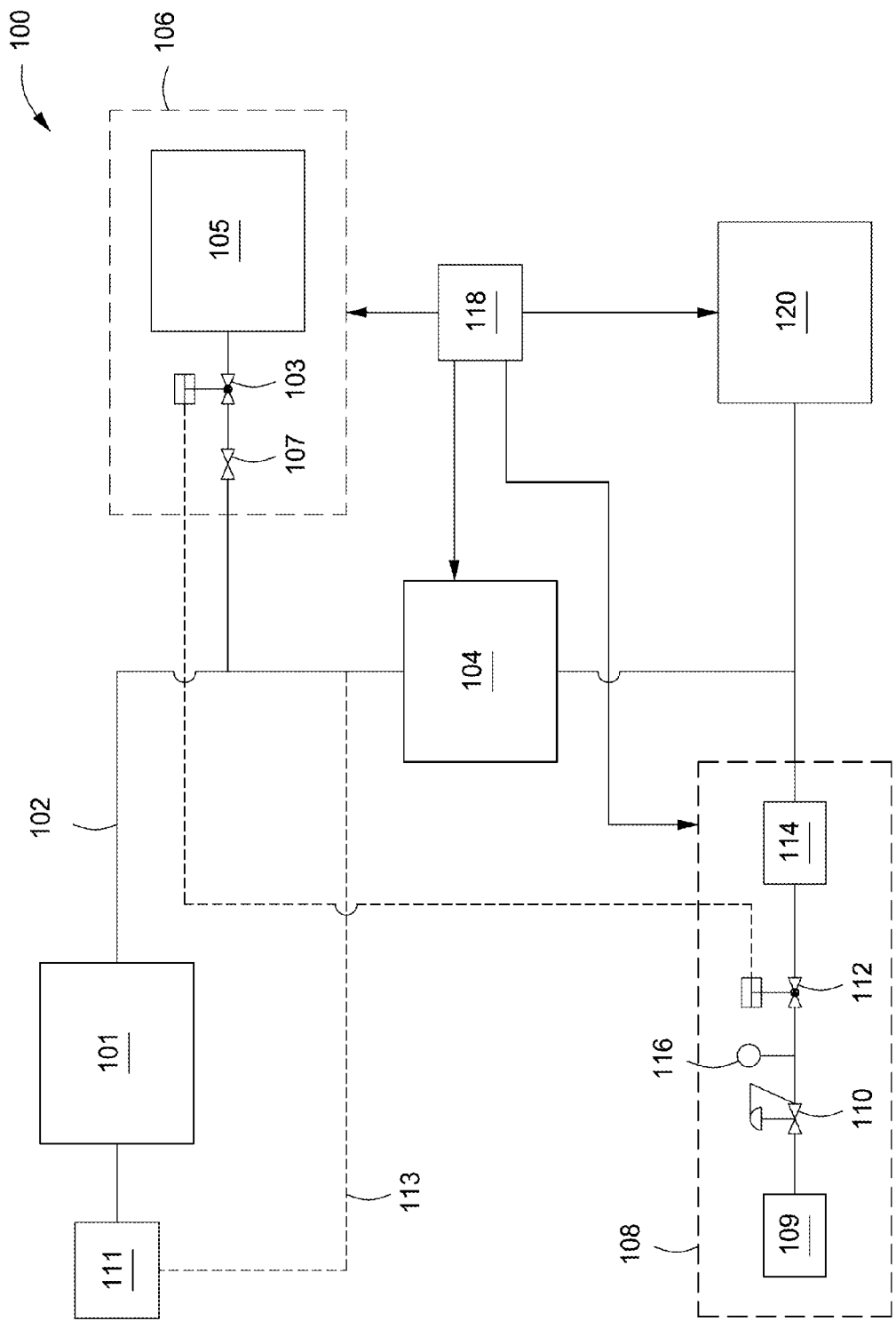
FIG. 1 depicts a substrate processing system in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods and apparatus for treating an exhaust gas in a foreline of a substrate processing system are provided herein. Embodiments of the present invention may advantageously provide improved abatement efficiency for perfluorocarbons (PFC's) and global warming gases (GWG's). Embodiments of the present invention may improve abatement efficiency by, for example, controlling a pressure in the foreline to optimize breakdown of PFCs and/or GWGs by reaction with one or more reagent gases. For example, the pressure may be controlled in real-time to maintain the pressure within a desired operating range, or may be adjusted in response to one or more reagent gases injected into the foreline.

For example, in some embodiments, a plasma including a reagent (such as water) may be formed in or delivered to the process foreline while controlling the pressure in the process foreline to more optimally form and/or maintain the plasma. In some embodiments, methods to selectively activate the pressure control in sequence with the tool process recipe are provided to enhance the efficiency of the system. In some embodiments, methods for cost effectively providing accurate and repeatable control of the reagent delivery rate are also provided. The combination of reagent injection control along with foreline pressure control may be provided to manage the plasma within an optimal operating range (for PFC or GWG abatement) in real-time.

Embodiments of the present invention enable an in-line plasma abatement system (for example as schematically depicted in FIG. 1) to maintain optimum abatement efficiency while minimizing use of foreline pressure control gases (such as $N_2$ or other gases discussed below), plasma reagents (such as water or other reagents discussed below), and electricity. The optimization can be optionally managed by real-time sensor feedback (examples include pressure, flow, and temperature), pre-determined operating conditions corresponding to each step in the recipe, or input from the process tool and gas control signals. The controlled, post-plasma foreline gas injection enables local line pressure control to optimize abatement performance. Alternatively, the foreline gas could be added pre-plasma (e.g., upstream of the RPS or IPS). However, a pre-plasma foreline gas addition would require considerably more plasma energy to fracture the foreline gas and the gases being abated (such as PFC's and GWG's) and could result in pressure cross-talk back to the process chamber.

Additional advantages of the post-plasma foreline gas injection include the reduction in temperature of the post abatement exhaust. As the pressure and gas flow in the exhaust line can change with each step in the recipe, this invention can adjust to each change in the recipe or for each operational condition to maintain optimum abatement efficiency while minimizing utilities and energy use for step. This control can be by set parameters time-synchronized to the process recipe, by real-time sensor feedback, or by monitoring the tool or gas panel control signals. If the abatement tool is in shutdown, idle, preventative maintenance, or bypass mode, energy and utilities can be minimized by use of the smart interface between the process chamber and the abatement device. For example, the smart interface may adjust the plasma power supply output to an appropriate power level to maintain target performance. The plasma power supply and reactor tube (or other component) lifetime depend on operating energy level. Wasting power by operating at a plasma energy level higher than is required for the abatement or clean gas within the reactor not only wastes energy, but shortens the duration between required maintenance. Further the abatement RPS or Inline Abatement Device smart interface may count and report: uptime, system warnings or faults, operating efficiency, operational hours, and utilities used, and may report real time or accumulative carbon footprint performance locally or to a central monitoring and reporting system. Further embodiments of this invention include a reagent delivery system designed and integrated with the foreline gas injection control to maintain a desired amount of reagent injected to the exhaust pre-plasma to maintain optimum abatement efficiency of PFC or GWG and to minimize reagent consumption.

A plasma source for foreline abatement may utilize a hydrogen or oxygen containing reagent, such as water vapor, in addition to the process exhaust, to enable PFC and GWG abatement in the foreline. FIG. 1 is a piping and instrumentation diagram that shows a typical plasma foreline abatement system in accordance with some embodiments of the invention. The plasma foreline abatement system may be coupled to or may be part of a larger processing system that produces or emits PFC's or GWG's that require abatement. Non-limiting examples of such systems include substrate processing systems such as those used in semiconductor, display, solar, or light emitting diode (LED) manufacturing processes.

Figure 2:
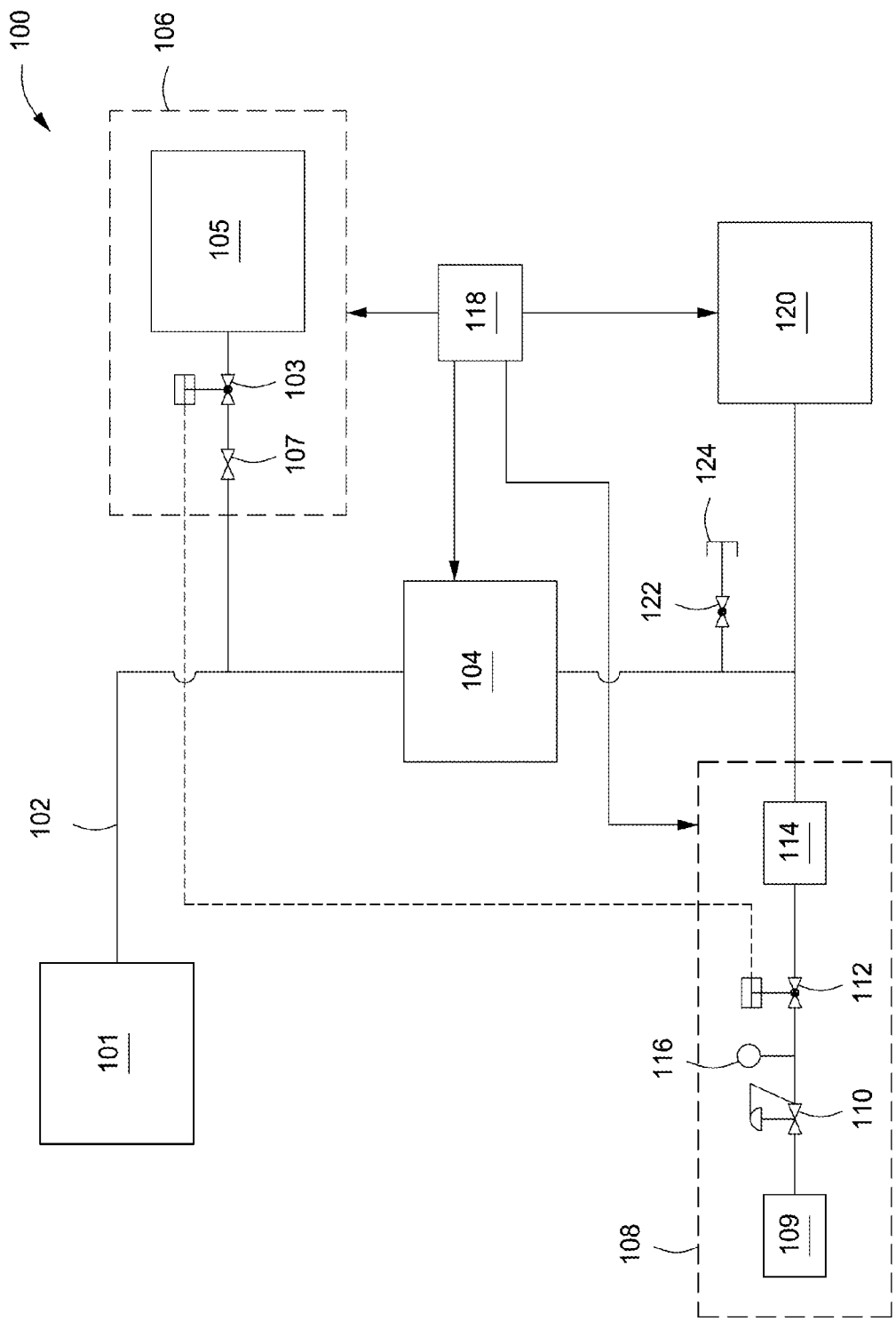
FIG. 2 depicts a substrate processing system in accordance with some embodiments of the present invention.
Figure 3:
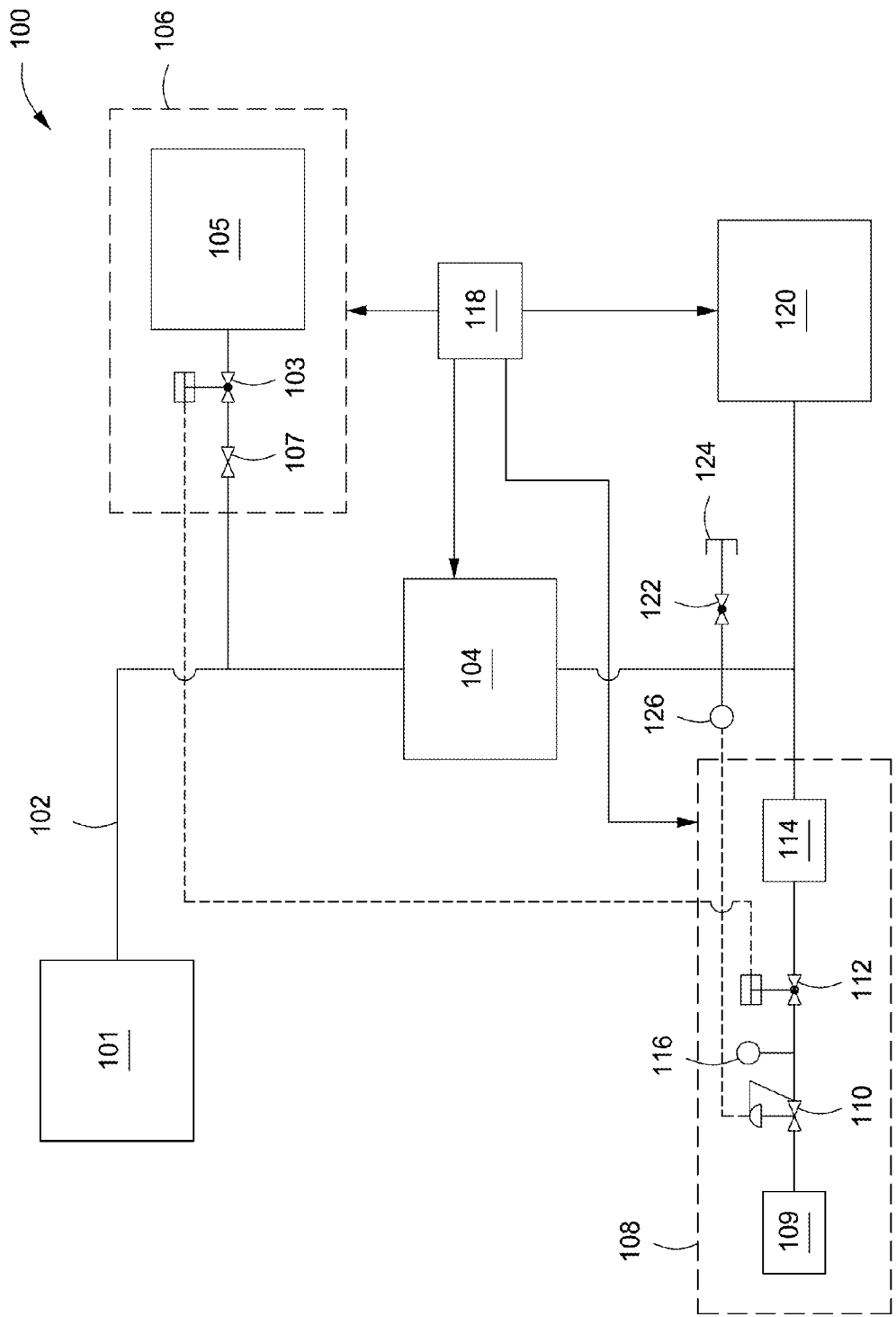
FIG. 3 depicts a substrate processing system in accordance with some embodiments of the present invention.

For example, FIG. 1 depicts a schematic diagram of a substrate processing system 100 in accordance with some embodiments of the present invention. As shown in FIG. 1, an exhaust conduit, or foreline 102 (for example, coupled to a process chamber or tool to carry exhaust from the chamber or tool, as indicated at 101), may be provided with a plasma source 104 (such as a remote plasma source (RPS)) coupled in-line with the foreline 102. The plasma source 104 may be implemented as a radical injector (e.g., an RPS) or as a process flow-through device (e.g., an IPS, where a plasma is created in the conduit through which the process exhaust flows). The plasma source 104 may be any plasma source coupled to the foreline 102 suitable for developing a plasma therein (such as a remote plasma source, an in-line plasma source, or the other suitable plasma source for generating a plasma—such as a capacitively coupled, inductively coupled, remote, or standing wave plasma—within the foreline or proximate the foreline and introduced into the foreline). The embodiments of FIGS. 1-3 are schematically represented and some components have been omitted for simplicity. For example, a high speed vacuum pump, such as a turbo pump or the like, may be disposed between the chamber 101 and the foreline 102 for removing exhaust gases from the chamber 101.

A reagent delivery system 106 may be coupled to the foreline 102 to deliver a reagent, such as water vapor, to the foreline 102 upstream of the plasma source 104. The reagent delivery system 106 may include a reagent source 105 (or multiple reagent sources (not shown)) coupled to the foreline 102 via one or more valves. For example, in some embodiments, a valve scheme may include a control valve 103 which acts as an on/off switch for releasing reagent from the reagent source 105 and a flow control device 107 for controlling the flow rate of reagent into the foreline 102. For example, as shown in FIG. 1, the flow control device 107 can be disposed between the foreline 102 and the control valve 103. The control valve 103 may be any suitable control valve such as a solenoid valve or the like. The flow control device 107 may be any suitable active or passive flow control device, for example, such as a fixed orifice, mass flow controller, needle valve or the like. In some embodiments, the reagent delivery system 106 may provide water vapor. In some embodiments, the reagent delivery system 106 may provide oxygen ($O_2$). However, use of $O_2$ as a reagent introduced into the foreline 102 may result in the formation of $OF_2$, which is very toxic. As such, $O_2$ may be used as a reagent primarily in regions where local regulations allow and/or where appropriate safety accommodations are in place.

Alternatively or in combination, reagents or additional reagents may be provided to the foreline 102 via a source coupled to the chamber 101, such as from a gas panel or the like. For example, in some embodiments, a gas panel and control system 111 coupled to the process chamber 101 can be used to supply a flow of a cleaning gas to the process foreline 102 upstream of the plasma source 104. The cleaning gas may facilitate removing deleterious deposits that can accumulate on surfaces of the plasma source 104, such as a lumen of a reactor tube of the plasma source 104.

The flow of the cleaning gas may be intermittent or continuous. The flow of the cleaning gas may be synchronized to the process for optimal cleaning and maximum substrate throughput. The cleaning gas may be most economically provided by the existing process gas panel and control system, which can supply any cleaning gas (such as, $NF_3$, $O_2$, Ar, $COF_2$, $H_2O$, $F_2$ or the like) either through the chamber (as shown) or optionally through a chamber bypass line (as shown by dashed line 113) that provides the cleaning gas prior to, or upstream of, the plasma source 104. In addition to providing optimal species to the plasma source 104 for cleaning, the intermittent or continuous addition of clean gas may be used to facilitate managing line pressure to provide optimal cleaning of deposits from the plasma abatement reactor tube. Although depicted only in FIG. 1, the gas panel and control system 111 and the methods of use thereof may be incorporated in any of the embodiments disclosed herein.

A foreline gas injection kit 108 may be coupled to the foreline 102 upstream or downstream of the plasma source 104 (downstream depicted in FIG. 1) to controllably provide a foreline gas, such as nitrogen ($N_2$), argon (Ar), or clean dry air (CDA), into the foreline 102 as desired to control the pressure within the foreline 102. In some embodiments, the foreline gas being added may also control the exhaust gas temperature downstream of the device. Reducing the temperature of the foreline may significantly reduce failure of the foreline and other post abatement elastomeric or metal seals, and process pump components.

In some embodiments, such as shown in FIG. 1, the foreline gas injection kit 108 may include a foreline gas source 109 followed by a pressure regulator 110 to set the gas delivery pressure setpoint, further followed by a control valve 112 to turn on and off the flow and finally a flow control device 114 such that a known flow of gas may be provided at the specific setpoint of the pressure regulator 110. The control valve 112 may be any suitable control valve, such as discussed above for control valve 103. The flow control device 114 may be any suitable flow control device, such as discussed above for flow control device 107. In some embodiments, the flow control device 114 is a fixed orifice. In some embodiments the foreline gas injection kit 108 may further include a pressure gauge 116, for example, disposed between the pressure regulator 110 and the flow control device 114. For example, the pressure gauge 116 may be used to measure pressure in the kit 108 upstream of the flow control device 114. For example, the measured pressure at the pressure gauge 116 may be utilized by a control device, such as a controller 118 discussed below, to set the pressure upstream of the flow control device 114 by controlling the pressure regulator 110.

In some embodiments, the control valve 112 may be controlled by the system (e.g., controller 118) to only turn gas on when the reagent from the reagent delivery system is flowing, such that usage of gas is minimized. For example, as illustrated by the dotted line between control valve 103 of the reagent delivery system 106 and the control valve 112 of the kit 108, the control valve 112 may turn on (or off) in response to the control valve 103 being turned on (or off). In some embodiments, the reagent may flow only when the plasma abatement unit is turned on and commanded to abate the process. Alternative methods of control can be used other than the embodiment described above, such as a mass flow controller or a flow control needle valve instead of the fixed size orifice. In some embodiments a time delay or pre-activation of line pressure or reagent addition control may be employed for optimal performance results and plasma stability.

The foreline 102 may be coupled to a vacuum pump or other suitable pumping apparatus, as indicated at 120, to pump the exhaust from the processing tool to appropriate downstream exhaust handling equipment (such as abatement equipment or the like). In some embodiments, the vacuum pump 120 may be a backing pump, such as a dry mechanical pump or the like. For example, the vacuum pump 120 may have a variable pumping capacity with can be set at a desired level, for example, to control or provided addition control of pressure in the foreline 102.

The controller 118 may be coupled to the foreline abatement system for controlling the operation thereof. The controller 118 may be provided and coupled to various components of the substrate processing system 100 to control the operation thereof. For example, the controller may monitor and/or control the foreline gas injection kit 108, the reagent delivery system 106, and/or the plasma source 104 in accordance with the teachings disclosed herein. In some embodiments, the controller may be part of or coupled to a controller (not shown) of the process chamber 101 coupled to the foreline 102 to control the foreline abatement system in concert with the processing and recipes running in the process chamber.

The controller 118 may include a central processing unit (CPU), a memory, and support circuits. The controller 118 may control the substrate processing system 100 directly, or via computers (or controllers) associated with particular process chamber and/or support system components. The controller 118 may be one of any form of general-purpose computer processor that can be used in an industrial setting for controlling various chambers and sub-processors. The memory, or computer readable medium, of the controller 118 may be one or more of readily available memory such as random access memory (RAM), read only memory (ROM), floppy disk, hard disk, optical storage media (e.g., compact disc or digital video disc), flash drive, or any other form of digital storage, local or remote. The support circuits are coupled to the CPU for supporting the processor in a conventional manner. These circuits include cache, power supplies, clock circuits, input/output circuitry and subsystems, and the like. Inventive methods as described herein may be stored in the memory as software routine that may be executed or invoked to control the operation of the substrate processing system 100 in the manner described herein. The software routine may also be stored and/or executed by a second CPU (not shown) that is remotely located from the hardware being controlled by the CPU of the controller 118.

The configuration in FIG. 1 is exemplary and other variants of components may be provided to supply the foreline gas, the reagent, and/or the plasma. In addition, other components may be included in the substrate processing system 100 to provide enhanced functionality, efficiency, ease of use, or the like. For example, in some embodiments, and as shown in FIG. 2, a vacuum valve 122 and a port 124, such as an $N_2$ blanked port, may be coupled to the foreline 102 for temporary connection of a vacuum gauge for preliminary setup, testing, and the like. In some embodiments, the vacuum valve 122 and the port 124 may be coupled to the foreline 102 between the plasma source 104 and the foreline gas injection kit 108.

In some embodiments, as shown in FIG. 3, a pressure gauge 126, such as a vacuum pressure transducer or the like, may be provided in the foreline 102 provide a pressure signal that may be used, for example, by the controller 118 in a feedback loop to control the regulating pressure of a pressure control valve 110 or the flow rate of the flow control device 114, for example in embodiments where a mass flow controller is used, to enable dynamic control of the operating pressure of the plasma source 104, e.g., the pressure in the foreline 102. In some embodiments, for example when the vacuum pump 120 has variable pumping capacity, the controller may adjust the pumping capacity of the vacuum pump 120 in response to a foreline pressure measured by the pressure gauge 126.

Figure 4:
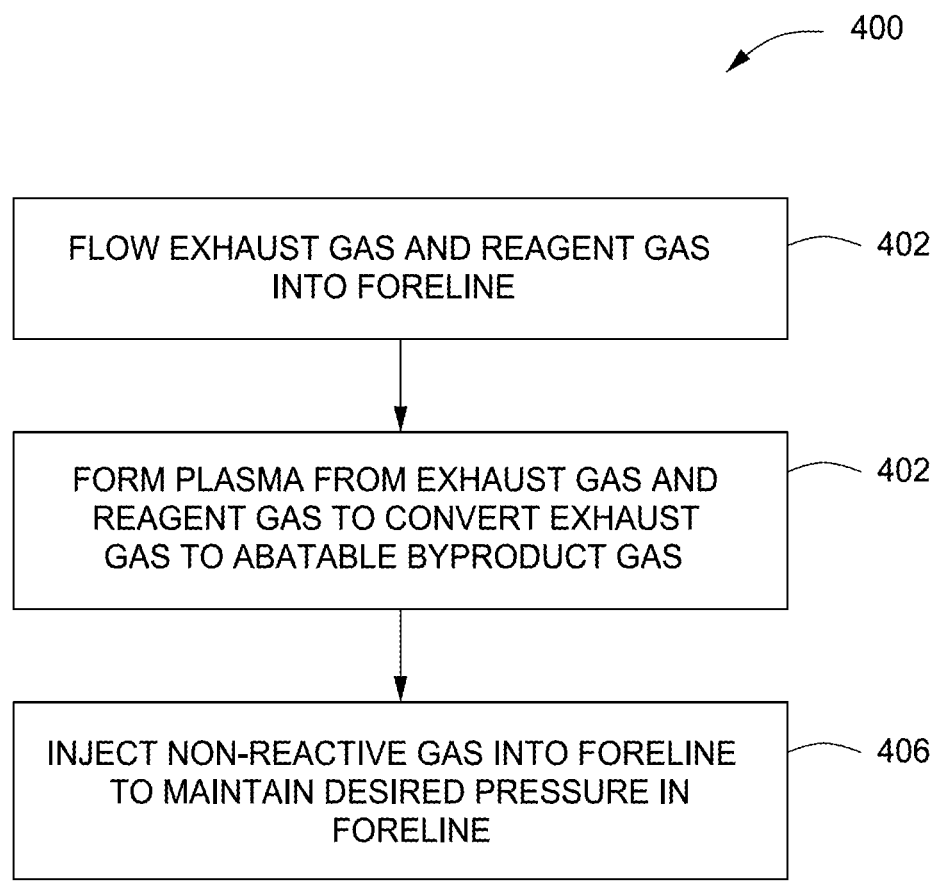
FIG. 4 depicts a flow chart of a method for treating an exhaust gas in accordance with some embodiments of the present invention.

FIG. 4 depicts a flow chart for a method 400 for treating an exhaust gas in the foreline of a processing system. For example, the method 400 may be utilized with any of the embodiments of the substrate processing system 100 discussed herein. The exhaust gas may include a variety of exhaust gases resultant from performing a process in the chamber 101, such as unreacted process gases, byproduct gases formed from the interaction of one or more process gases and/or interaction of a process gas with a substrate, or the like. Exhaust gases that may benefit from the methods disclosed herein include, but are not limited to, PFCs and GWGs. The method 400 begins at 402 by flowing an exhaust gas and a reagent gas into a foreline, such as the foreline 102, of a substrate processing system, such as the substrate processing system 100. For example, the exhaust gas may have originated at the process chamber 101 and resulted from performing any of a number of processes, such as etching, deposition, cleaning, or the like. The reagent gas may be injected into the foreline 102, for example, by the reagent delivery system 106.

At 404, a plasma may be formed form the exhaust gas and the reagent gas to convert the exhaust gas in abatable byproduct gases. For example, the abatement process can be illustrated by the following simple chemical formulas, for example, for $CF_4$ or $NF_3$ breakdown via plasma:

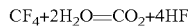

$$CF_4 + 2H_2O = CO_2 + 4HF$$

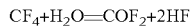

$$CF_4 + H_2O = COF_2 + 2HF$$

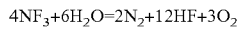

$$4NF_3 + 6H_2O = 2N_2 + 12HF + 3O_2$$

The PFC or other global warming gas ($CF_4$ and $NF_3$ in the exemplary embodiments above), is reacted to break down the global warming gas and convert the fluorine to HF, which is easily scrubbed by traditional wet scrubbing technologies.

The ability of a remote plasma source or in-line plasma source to deliver energy to the plasma is dependent on matching of the power circuit of the remote plasma source to the operating process conditions. Hence, if the pressure in the vacuum foreline is too low, as a result of low process flow or large safety factor incorporated in the design of the vacuum system, it is not possible to deliver full power to the plasma and consequently the destruction efficiency for the PFC and GWG is undesirably reduced.

Accordingly, and at 406, a non-reactive gas may be injected into the foreline 102 to maintain a desired pressure in the foreline for optimal conversion of the exhaust gas. For example, the non-reactive gas may be injected by the foreline gas injection kit 108. In some embodiments, for example as illustrated in FIG. 1, a first amount of the non-reactive gas may be injected in response to a second amount of the reagent gas flowed into the foreline 102. For example, the controller may control the control valve 112 of the kit 108 to open or close in response to the opening or closing of the control valve 103 of the reagent delivery system 106. Alternatively, the injection of the non-reactive gas may be response to a pressure level in the foreline 102. For example, the pressure level in the foreline 102 as indicated by the pressure gauge 126 may be monitored by the controller 118. The controller may adjust the flow rate of the non-reactive gas in the foreline 102 in response to the monitored pressure level. For example, the controller 118 may adjust one or more of the pressure regulator 110 or the flow control device 114 to maintain the desired pressure level in the foreline 102.

In some embodiments, the method 400 may include flowing a cleaning gas into the foreline 102 to remove material deposited during conversion of the exhaust gas. For example, material may accumulate on one or more of surfaces of the foreline 102 or surfaces of the plasma apparatus 104. The flowing of the cleaning gas may occur, for example, between a desired number of process runs performed in the substrate processing system 100. For example, a desired number of process runs may include between each substrate being processed, between a desired number of substrates being processed, or the like. Further, the cleaning gas may be provide by any of a number of sources, for example from the reagent delivery system 106, or from the process chamber 101, such as via a gas panel or the like.

In some embodiments, in operation, the foreline pressure and the stoichiometric ratio of water to a target species being abated with the plasma may be controlled, both separately and in concert with each other, for plasma abatement optimization. Embodiments of the present invention allow for tuning and setting fixed setpoints for these parameters. In some embodiments, the circuits may be tuned to control water ratio and local pressure via a pre defined recipe. In some embodiments, signals from the process controller may be used to set conditions, or signals from the chamber or process controller to the gas box may be used to control these setpoints. In some embodiments, in addition to controlling the foreline pressure and the stoichiometric ratio of water to a target species being abated with the plasma, the plasma power and RF match characteristics may also be tuned for different steps/parts of the process recipe. In addition to real time, by feedback sensor(s), or by recipe control of foreline pressure and control of stoichiometric ratio of water, in some embodiments the power output from the power supply may also be varied to add more power to the plasma for process steps that require greater power to achieve desired destruction removal efficiency and reduce the power consumption for steps that do not require as much power to achieve desired DRE.

For example, test results of processing in accordance with embodiments of the present invention show that the addition of a foreline gas injection kit to the system advantageously allows the pressure in the remote plasma source to be controlled for optimum power delivery to the plasma. Some embodiments of the invention may use a pressure regulator to set the nitrogen delivery pressure to a known setpoint, followed by a control valve to turn on and off the flow and finally an appropriately sized orifice such that a known flow of gas is provided at the specific set point of the pressure regulator. The nitrogen On/Off control valve may be controlled by the system to only turn gas on when water vapor is flowing such that usage of nitrogen is minimized. In some embodiments, the water vapor flow may flow only when the remote plasma abatement unit is turned on and commanded to abate the process. Alternative methods of nitrogen control can be used other than the embodiment described above, such as a mass flow controller or a flow control needle valve instead of the fixed size orifice. In some cases, for optimal operating conditions, a delayed or preemptive control signal may be used to start or stop reagent or foreline pressure flow control.

High abatement efficiency is also dependent on accurate setting of the water flow rate. The water delivery system includes a water tank that operates under vacuum conditions such that the water boils at low temperature from ambient to about 35 degrees Celsius. Control of the water vapor flow rate may be determined by the adjustment of the flow control device 107. To enable accurate setting of this valve and repeatability of the setting, a micrometer needle valve has been incorporated so that the set point can be dialed in and specified precisely for a specific recipe, tool set, and/or operating condition. Once an application set point has been defined, future units manufactured for the application can be factory preset to the desired setting.

Although discussed above in context of an exhaust line abatement system, embodiments of the present invention may also apply to abatement, line cleaning, and chamber clean plasma applications.

Thus, methods and apparatus for treating an exhaust gas in a foreline of a substrate processing system have been provided herein. Embodiments of the present invention may advantageously provide improved abatement efficiency for perfluorocarbons (PFC's) and global warming gases (GWG's). Embodiments of the present invention may improve abatement efficiency by controlling a pressure in the foreline to optimize breakdown of PFCs and/or GWGs by reaction with one or more reagent gases. For example, the pressure may be controlled in real-time to maintain the pressure within a desired operating range, or may be adjusted in response to one or more reagent gases injected into the foreline.

While the foregoing is directed to embodiments of the present invention, other and further embodiments of the invention may be devised without departing from the basic scope thereof.

The invention claimed is:

1. An apparatus for treating an exhaust gas in an exhaust conduit of a substrate processing system, comprising:
    a plasma source coupled to an exhaust conduit of a process chamber;
    a reagent source coupled to the exhaust conduit upstream of the plasma source; and
    a gas injection kit coupled to the exhaust conduit to controllably deliver a gas to the exhaust conduit to control an exhaust conduit pressure, wherein the gas injection kit includes:
        a pressure regulator to set a gas delivery pressure setpoint; and
        a first pressure gauge to monitor a delivery pressure of the gas wherein the gas injection kit is coupled to the exhaust conduit downstream of the plasma source.

2. The apparatus of claim 1, wherein the gas injection kit further comprises:
    a flow control device to provide a known flow of the gas at the pressure setpoint of the pressure regulator.

3. The apparatus of claim 2, wherein the pressure gauge is disposed between the pressure regulator and the flow control device to monitor the delivery pressure of the gas upstream of the flow control device.

4. The apparatus of claim 3, wherein the flow control device is a fixed orifice.

5. The apparatus of claim 3, wherein the flow control device comprises a mass flow controller or a mass flow meter.

6. The apparatus of claim 1, wherein the gas injection kit further comprises:
    a control valve to selectively turn on and off the flow of the gas to the exhaust conduit.

7. The apparatus of claim 6, wherein the control valve comprises a solenoid valve.

8. The apparatus of claim 1, further comprising:
    a second pressure gauge coupled to the exhaust conduit to monitor a pressure within the exhaust conduit downstream of the plasma source.

9. The apparatus of claim 8, further comprising:
    a controller to control the pressure.

10. The apparatus of claim 9, wherein the controller adjusts the pressure regulator based on the pressure measured by the second pressure gauge.

11. The apparatus of claim 9, wherein the controller controls a flow rate of reagent provided to the exhaust conduit by the reagent source and a flow rate of the gas provided by the gas injection kit.

12. The apparatus of claim 9, further comprising:
    a vacuum pump having variable pumping capacity coupled to the exhaust conduit.

13. The apparatus of claim 12, wherein the controller adjusts the pumping capacity of the vacuum pump based on the pressure measured by the second pressure gauge.

14. An apparatus for treating an exhaust gas from a substrate processing system, comprising:
    a reagent source located downstream of a processing chamber to provide a reagent to a flow of the exhaust gas;
    a plasma source located downstream of the reagent source to form a plasma from the reagent and the exhaust gas; and
    a gas injection kit to controllably deliver a gas to control an exhaust gas pressure, wherein the gas injection kit includes:
        a pressure regulator to set a gas delivery pressure setpoint; and
        a first pressure gauge to monitor a delivery pressure of the gas wherein the gas injection kit is coupled to the exhaust conduit downstream of the plasma source.

* * * * *